(12) United States Patent
Wang et al.

(10) Patent No.: US 9,105,475 B1
(45) Date of Patent: Aug. 11, 2015

(54) METHOD FOR FORMING FIN FIELD EFFECT TRANSISTOR

(71) Applicant: Tsinghua University, Beijing (CN)

(72) Inventors: Jing Wang, Beijing (CN); Lei Xiao, Beijing (CN); Mei Zhao, Beijing (CN); Renrong Liang, Beijing (CN); Jun Xu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 14/347,930

(22) PCT Filed: Mar. 18, 2014

(86) PCT No.: PCT/CN2014/073592
§ 371 (c)(1),
(2) Date: Mar. 27, 2014

(51) Int. Cl.
H01L 29/417 (2006.01)
H01L 21/02 (2006.01)
H01L 29/66 (2006.01)
H01L 29/161 (2006.01)
H01L 21/479 (2006.01)

(52) U.S. Cl.
CPC .... *H01L 21/02694* (2013.01); *H01L 21/02631* (2013.01); *H01L 21/479* (2013.01); *H01L 29/161* (2013.01); *H01L 29/41791* (2013.01); *H01L 29/66795* (2013.01)

(58) Field of Classification Search
CPC .................................................. H01L 21/8232
See application file for complete search history.

(56) References Cited

U.S. PATENT DOCUMENTS

2011/0248348 A1* 10/2011 Gan et al. ...................... 257/369

* cited by examiner

*Primary Examiner* — Cheung Lee
(74) *Attorney, Agent, or Firm* — Houtteman Law LLC

(57) ABSTRACT

A method for forming a fin field effect transistor is provided. The method includes: providing a substrate; forming a fin structure with a material Ge or GeSi on the substrate; implanting atoms, molecules, ions or plasmas containing an element Sn into the fin structure with the material Ge or GeSi to form a Ge-based GeSn layer or a Ge-based GeSnSi layer; and forming a gate stack on the Ge-based GeSn layer or the Ge-based GeSnSi layer, the gate stack being oriented transversely to the fin structure.

20 Claims, 3 Drawing Sheets

METHOD FOR FORMING FIN FIELD EFFECT TRANSISTOR

CROSS-REFERENCE TO RELATED APPLICATIONS

This application claims priority to and benefits of the following applications:
1) Chinese Patent Application Serial No. 201410064550.X, filed with the State Intellectual Property Office of P. R. China on Feb. 25, 2014;
2) Chinese Patent Application Serial No. 201410063292.3, filed with the State Intellectual Property Office of P. R. China on Feb. 25, 2014; and
3) Chinese Patent Application Serial No. 201410063181.2, filed with the State Intellectual Property Office of P. R. China on Feb. 25, 2014.

The entire contents of the above applications are incorporated herein by reference.

FIELD

The present disclosure relates to a semiconductor design and fabrication field, and more particularly to a method for forming a fin field effect transistor (FinFET).

BACKGROUND

With an increasingly scaling down of a feature size of MOSFET (metal-oxide-semiconductor field-effect transistor), especially a feature size of a gate length, a short-channel effect becomes more and more serious. In order to effectively suppress the short-channel effect, a FinFET is proposed, a channel of which is thin enough and is only disposed at a place very close to a gate thus eliminating all leakage channels apart from the gate. The FinFET, which may greatly improve a control capability of the gate over the channel and effectively suppress the short-channel effect, has advantages of high drive current, low off-state current, high on/off current ratio, low cost and high transistor density. Moreover, the FinFET devices may be fabricated on a cheap Si or Si-on-insulator (SOI) substrate.

In addition, also with the increasingly scaling down of the feature size of MOSFET, a low carrier mobility of Si has become a primary factor restraining a performance of the devices. In order to solve the problem, a material with higher mobility is adopted as the channel material, for example, Ge or $Ge_{1-z}Si_z$ (0<z<1) (GeSi) alloy is adopted as the channel material in PMOSFETs, and a group III-V compound semiconductor material is adopted as the channel material in NMOSFETs. A hole mobility of Ge is around four times as great as that of Si, and currently most technical difficulties for a Ge channel MOSFET have been overcome. A group IV semiconductor material Ge-based $Ge_{1-x}Sn_x$ (0<x<1) (GeSn) alloy compatible with Ge has a good electrical property.

However, it is difficult to directly grow a GeSn alloy with high crystalline quality and high Sn content. The reasons are illustrated as follows. Firstly, an equilibrium solid solubility of Sn in Ge is less than 1% (i.e., about 0.3%); secondly, a surface segregation of Sn easily occurs because the surface energy of Sn is smaller than that of Ge; and thirdly, there is a large lattice mismatch (about 14.7%) between Ge and α-Sn. In order to suppress the surface segregation of Sn and increase the content of Sn, a certain amount of Si may be doped during a growth to form a $Ge_{1-x-y}Sn_xSi_y$ (0<x<1, 0<y<1) (GeSnSi) layer. Because a lattice constant of Si is smaller than that of Ge, but a lattice constant of Sn is larger than that of Ge, a thermal stability of the GeSnSi alloy may be improved by doping Si into it.

It is difficult to fabricate GeSn and GeSnSi since both materials are metastable Ge-based materials. Molecular beam epitaxy (MBE) is conventionally used for growing the GeSn alloy. By using such a method, a GeSn film with high crystal quality may be obtained. Disadvantages (such as expensive equipment, time-consuming fabrication process and high cost) of such a method, however, limit a large scale production. In addition, a uniformity of the film formed by MBE needs to be further improved. Alternatively, chemical vapor deposition (CVD) is also used for growing the GeSn or GeSnSi film but has disadvantages of poor film quality, poor thermal stability and easy segregation of Sn. Moreover, a selective epitaxial growth of the GeSn or GeSnSi films is needed for the FinFET structure. In theory CVD is proper for selectively growing the GeSn or GeSnSi films, however, it is not the case in practice because of disadvantages of poor film quality, immature and complicated process and high cost.

SUMMARY

Embodiments of the present disclosure seek to solve at least one of the problems existing in the related art to at least some extent.

According to the present disclosure, a method for forming a FinFET is provided. The method comprises: providing a substrate; forming a fin structure with a material Ge or GeSi on the substrate; implanting atoms, molecules, ions or plasmas containing an element Sn into the fin structure with the material Ge or GeSi to form a Ge-based GeSn layer or a Ge-based GeSnSi layer; and forming a gate stack on the Ge-based GeSn layer or the Ge-based GeSnSi layer, the gate stack being oriented transversely to the fin structure.

With the method for forming the FinFET, a Ge-based material of GeSn or GeSnSi channel with a better crystalline quality is obtained, such that an electrical performance of the FinFET is significantly improved. In addition, the method is simple to implement and low in cost.

In one embodiment, the method further comprises: co-implanting atoms, molecules, ions or plasmas containing the element Sn and an element Si into the fin structure with the material Ge to form the Ge-based GeSnSi layer.

In one embodiment, the fin structure with the material Ge or GeSi is formed by a selective epitaxial growth.

In one embodiment, the fin structure with the material Ge is formed by a photolithography and etching, and the substrate has a surface with a material Ge.

In one embodiment, the fin structure with the material GeSi is formed by a photolithography and etching, and the substrate has a surface with the material GeSi.

In one embodiment, the atoms, molecules, ions or plasmas containing the element Sn are implanted into the fin structure with the material Ge or GeSi by an ion implantation.

In one embodiment, the ion implantation comprises a plasma source ion implantation and a plasma immersion ion implantation.

In one embodiment, the atoms, molecules, ions or plasmas containing the element Sn are implanted into the fin structure with the material Ge or GeSi by a magnetron sputtering.

In one embodiment, during the magnetron sputtering, a negative bias voltage is applied to the substrate.

In one embodiment, a Sn coating film is formed on the Ge-based GeSn layer or the Ge-based GeSnSi layer during the magnetron sputtering, in case the atoms, molecules, ions or plasmas containing the element Sn are implanted; or a Si—Sn coating film is formed on the Ge-based GeSn layer or the Ge-based GeSnSi layer during the magnetron sputtering, in case the atoms, molecules, ions or plasmas containing the element Sn and the element Si are co-implanted.

In one embodiment, the method further comprises removing the Sn coating film or the Si—Sn coating film.

In one embodiment, the method further comprises heating the substrate at a heating temperature ranging from 100° C. to 600° C. during the implanting.

In one embodiment, the heating temperature ranges from 150° C. to 450° C.

In one embodiment, the method further comprises annealing the Ge-based GeSn layer or the Ge-based GeSnSi layer at an annealing temperature ranging from 100° C. to 600° C. after the implanting.

In one embodiment, the annealing temperature ranges from 150° C. to 450° C.

In one embodiment, the Ge-based GeSn layer or the Ge-based GeSnSi layer is strained.

In one embodiment, a thickness of the strained Ge-based GeSn layer or the strained Ge-based GeSnSi layer ranges from 0.5 nm to 100 nm.

In one embodiment, the thickness of the strained Ge-based GeSn layer or the strained Ge-based GeSnSi layer ranges from 5 nm to 60 nm.

In one embodiment, a Sn content of the strained Ge-based GeSn layer or the strained Ge-based GeSnSi layer is less than 20% by atom percent.

In one embodiment, the method further comprises forming a source and a drain in the fin structure and on both sides of the gate stack, respectively.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
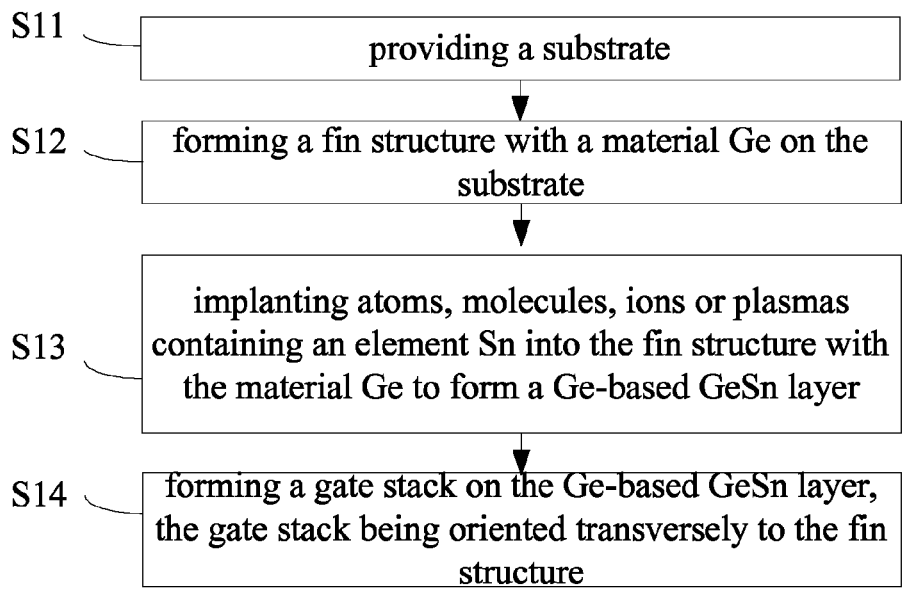
FIG. 1 is a flow chart of a method for forming a FinFET with a GeSn channel according to a first embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present disclosure be constructed or operated in a particular orientation.

A method for forming a FinFET is provided according to embodiments of the present disclosure. The method comprises: providing a substrate; forming a fin structure with a material Ge or GeSi on the substrate; implanting atoms, molecules, ions or plasmas containing an element Sn or containing elements Sn and Si into the fin structure with the material Ge or GeSi to form a Ge-based GeSn layer or a Ge-based GeSnSi layer; and forming a gate stack on the Ge-based GeSn layer or the Ge-based GeSnSi layer, the gate stack being oriented transversely to the fin structure.

With the method for forming the FinFET according to embodiments of the present disclosure, a surface modification is performed for the original fin structure with the material Ge or GeSi by using an implantation process, that is, the atoms, molecules, ions or plasmas containing the element Sn or containing the elements Sn and Si are implanted into the original fin structure with the material Ge or GeSi. By adjusting a temperature and an implanting dose, the implanted element Sn may not be diffused obviously, such that the Sn atoms in lattice may not be aggregated to form a Sn precipitate, thus keeping a GeSn or GeSnSi alloy in its metastable state without precipitation and surface segregation. In this way, a GeSn or GeSnSi channel with a better crystalline quality is obtained, such that an electrical performance of the FinFET is significantly improved. In addition, the method is simple to implement and low in cost.

In terms of conventional methods for forming a FinFET, a MBE method has disadvantages of expensive equipment, ultra-high vacuum, time-consuming fabrication process and high cost, and a CVD method has disadvantages of poor film quality, poor thermal stability, high cost and easy segregation of Sn at a high growth temperature. In addition, it is difficult to form a high quality Ge-based film in a selective region by both the MBE method and the CVD method, that is, neither the MBE method nor the CVD method is proper for selectively growing the high quality Ge-based film. In addition, since a nonplanar Ge-based film is required for forming the FinFET, a uniformity of the nonplanar film formed by MBE is not good.

Three embodiments will be illustrated below in detail with reference to FIGS. 1-6.

FIG. 1 is a flow chart of a method for forming a FinFET with a GeSn channel according to a first embodiment of the present disclosure. As shown in FIG. 1, the method may comprise following steps.

At step S11, a substrate 00 is provided. Specifically, the substrate 00 may be a semiconductor substrate, including, but not limited to, a Si (silicon) substrate, a Ge (germanium) substrate, a Si-on-insulator substrate, a Ge-on-insulator substrate, and a Si substrate with a Ge surface.

Figure 2A:
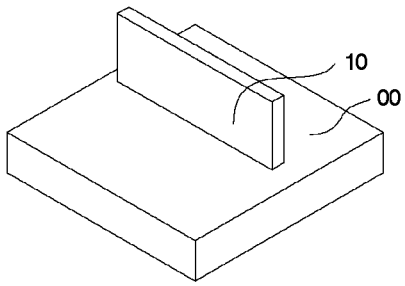
FIG. 2a is a schematic perspective view of a fin structure formed on a substrate according to an embodiment of the present disclosure.
Figure 2B:
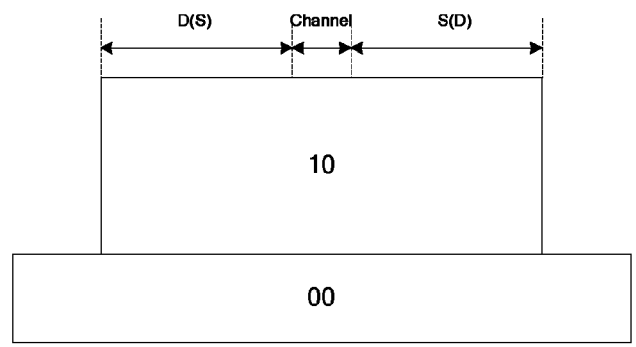
FIG. 2b is a cross-sectional view of the fin structure shown in FIG. 2a in a length direction of a channel.

At step S12, a fin structure 10 with a material Ge is formed on the substrate 00, as shown in FIGS. 2a and 2b, in which FIG. 2a is a schematic perspective view of the fin structure 10 formed on the substrate 00, and FIG. 2b is a cross-sectional view of the fin structure 10 shown in FIG. 2a in a length direction of a channel of the FinFET. Specifically, the fin structure 10 with the material Ge is formed on a specific region of the substrate 00 where a source, a drain and a channel are preset.

In an exemplary example, the fin structure 10 with the material Ge may be formed by a selective epitaxial growth. In this case, since the material Ge of the fin structure 10 is not an inherent material of the substrate 00 but is epitaxially grown on the substrate 00 later, the substrate 00 may be selected from a broad range of substrates, such as a Si substrate, a Ge substrate, a Si-on-insulator substrate, a Ge-on-insulator substrate, a Si substrate with a Ge surface, a GeSi-on-insulator substrate, a Si substrate with a GeSi surface, and a Ge substrate with a GeSi surface. In some embodiments, the substrate 00 may be one of a Si substrate, a Si-on-insulator substrate, a Ge-on-insulator substrate, and a Si substrate with a Ge surface.

In another exemplary example, the fin structure 10 with the material Ge may be formed by a photolithography and etching. In this case, since the material Ge of the fin structure 10 is the inherent material of the substrate 00, the substrate 00 may be selected from a relatively narrow range of substrates, such as a Ge substrate, a Ge-on-insulator substrate, or a Si substrate with a Ge surface, that is, the substrate 00 should at least have a Ge surface.

At step S13, atoms, molecules, ions or plasmas containing an element Sn are implanted into the fin structure 10 with the material Ge to form a GeSn layer.

In one embodiment, a surface of the fin structure 10 may be implanted to form the GeSn layer. In another embodiment, the whole fin structure 10 may be implanted to form the GeSn layer. If a thick GeSn layer is required, only the ions or plasmas which have higher energy may be implanted into the fin structure 10 to arrive at an intended depth. If a thin GeSn layer is required, the atoms, molecules, ions or plasmas may be implanted into the fin structure 10.

In an exemplary example, the implantation may be implemented by an ion implantation, that is, an ion beam (including ions or plasmas) with certain energy and containing the element Sn is injected into the fin structure 10 with the material Ge, such that a part of the fin structure 10 or the whole fin structure 10 is converted into a GeSn alloy (i.e., the GeSn layer). An implanting depth depends on the energy of the ion beam, that is, the higher the energy of the ion beam is, the larger the implanting depth is, and thus the thicker the GeSn layer is. In one embodiment, a thickness of the GeSn layer may range from 0.5 nm to 100 nm. During the implanting, a varying voltage may be used to vary the energy of the ion beam, such that the element Sn may be distributed uniformly within a certain range. Specifically, the ion implantation may comprise a plasma source ion implantation and a plasma immersion ion implantation, i.e., a plasma-based ion implantation (PBII). For the PBII, the fin structure 10 with the material Ge is immersed in the plasmas containing the element Sn, positive plasmas containing the element Sn are accelerated by an electric field, injected to the surface of the fin structure 10 and finally implanted into the fin structure 10. It is easy to achieve a high implanting dose by the PBII, for example, a Sn content of the GeSn layer may range from 1% to 20%. In this way, a production efficiency is improved and the cost is lowered. Since the PBII is less affected by a morphology of a substrate surface, it is particularly preferred for nonplanar structures (such as the fin structure) to ensure a uniform implantation, such that a uniform GeSn film may be formed in the whole channel region, thus greatly improving the electrical performance of the channel.

In another exemplary example, the implantation may be implemented by a magnetron sputtering. During the magnetron sputtering, Ar ions are accelerated by an electric field to reach a Sn or Sn-contained target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the fin structure 10 with the material Ge at a higher speed. A portion of the sputtered particles may be implanted into the fin structure 10 to form the metastable GeSn alloy. Alternatively, during the magnetron sputtering, a negative bias voltage (for example, ranging from −40 to −120V) is applied to the substrate 00, which may provide the portion of the sputtered particles with higher energy so as to implant these sputtered particles into a larger depth (such as a few nanometers) of the fin structure 10. It should be noted that, because a great number of particles are sputtered, a Sn coating film may be further formed on the GeSn layer. Therefore, the method further comprises removing the Sn coating film, for example, by means of a rinse solution with a high selective etching ratio between GeSn and Sn. Such a rinse solution comprises: diluted hydrochloric acid, diluted sulphuric acid and diluted nitric acid. After rinsing, the thickness of the GeSn layer may range from 0.5 nm to 20 nm, preferably, from 0.5 nm to 10 nm.

In one example, an ion beam sputtering is also used to implant Sn atoms into the fin structure 10. Compared with the magnetron sputtering, during the ion beam sputtering, an ion beam is introduced via an ion optical system so as to avoid an influence of a plasma ambiance on the sputtering process. By adjusting the energy of the ion beam, most sputtered particles may contain only a single Sn atom and Sn atoms in the GeSn layer are not liable to aggregation, thus improving the quality and the thermal stability of the GeSn layer.

Figure 3:
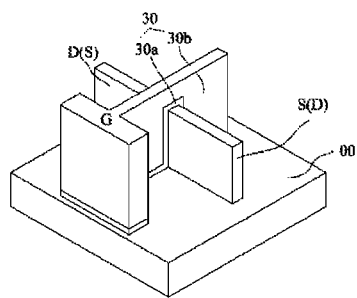
FIG. 3 is a schematic perspective view of a FinFET according to an embodiment of the present disclosure.

At step S14, a gate stack 30 is formed on the GeSn layer and is oriented transversely to the fin structure 10, as shown in FIG. 3. Specifically, the gate stack 30 comprises a gate dielectric layer 30a and a gate metal 30b.

In one embodiment, the method further comprises forming a side wall on both sides of the gate stack 30. The side wall may reduce a leakage current of a device.

Figure 4A:
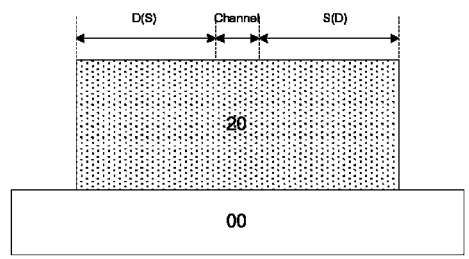
FIG. 4a is a cross-sectional view of the FinFET shown in FIG. 3 in the length direction of the channel, in which a material of a source and a drain is the same as that of the channel.
Figure 4B:
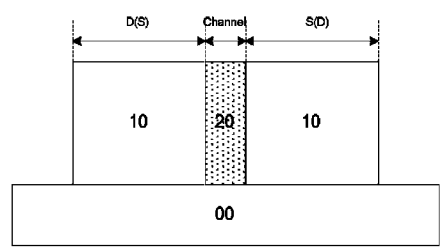
FIG. 4b is a cross-sectional view of the FinFET shown in FIG. 3 in the length direction of the channel, in which the material of the source and the drain is different from that of the channel.

In one embodiment, the method further comprises forming a source and a drain in the fin structure and on both sides of the gate stack respectively. A material of the source and the drain may be GeSn or Ge. If the material of the source and the drain is GeSn, the whole fin structure 10 with the material Ge is implanted to form the GeSn layer 20, as shown in FIG. 4a. In this case, the GeSn layer 20 functions as the source, the drain and the channel. If the material of the source and the drain is Ge, only a central region (i.e., a channel region) of the fin structure 10 with the material Ge is implanted to form the GeSn layer 20, as shown in FIG. 4b, while a remaining region (i.e., preset for a source region and a drain region) of the fin structure 10 is covered by photoresist or other hard mask. In this case, the GeSn layer 20 functions only as the channel. It should be noted that, the source and the drain may be formed either after or before forming the gate stack. That is, for a gate-first process, firstly the gate stack is formed and then the source and the drain are formed; for a gate-last process, firstly a dummy gate is formed on the GeSn layer 20, then the source and the drain are formed on both sides of the dummy gate respectively, and finally the dummy gate is removed and the gate stack is formed at a place where the dummy gate is originally formed.

With the method for forming the FinFET, the GeSn channel with a better crystalline quality is obtained, such that the electrical performance of the FinFET is significantly improved. In addition, the method is simple to implement and low in cost.

In this embodiment, the substrate 00 may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., less than 100° C.), such that the quality of the GeSn layer may be poor and GeSn in the GeSn layer is liable to form an amorphous state. Sn atoms in the GeSn layer may be seriously diffused at an over high heating temperature (e.g., higher than 600° C.), such that Sn atoms may be segregated from the GeSn layer since an equilibrium solid solubility of Sn in Ge is very low.

In this embodiment, the GeSn layer may be annealed after the implanting so as to further improve the crystal quality of the GeSn layer. An annealing temperature may range from 100° C. to 600° C., preferably from 150° C. to 450° C. The lattice damage resulting from the implantation may not be repaired at an over low annealing temperature (e.g., less than 100° C.), such that the quality of the GeSn layer may be poor. Sn atoms in the GeSn layer may be seriously diffused at an over high annealing temperature (e.g., higher than 600° C.), such that the Sn atoms may be segregated from the GeSn layer since the equilibrium solid solubility of Sn in Ge is very low.

In this embodiment, the GeSn layer is strained. A thickness of the strained GeSn layer may range from 0.5 nm to 100 nm, preferably from 5 nm to 60 nm. In this embodiment, a Sn content of the strained GeSn layer is less than 20% by atom percent. It should be noted that, the higher the Sn content of the fully strained GeSn layer is, the larger the strain degree of the fully strained GeSn layer is, and correspondingly the thickness of the strained GeSn layer should be less than its critical thickness to keep it fully strained, that is, the higher the Sn content of the strained GeSn layer is, the smaller the critical thickness of the strained GeSn layer is. Here, the critical thickness is determined by a condition that strain energy of the strained GeSn layer is equal to a minimum dislocation formation energy. For example, when the Sn content of the strained GeSn layer is 10%, the strain degree of the fully strained GeSn layer is about 1.5%, and the critical thickness of the strained GeSn layer is about 30 nm, that is, a thickness of the channel of the FinFET should be equal to or less than 30 nm. Also for example, when the Sn content of the strained GeSn layer is 5%, the strain degree thereof is about 0.8%, and the critical thickness thereof may be over 100 nm, that is, the thickness of the channel of the FinFET may be 100 nm while the GeSn layer remains fully strained.

It should be noted that, when the GeSn layer is strained, the heating temperature and the annealing temperature need to match with material properties of the strained GeSn layer. For example, because the Sn content of the strained GeSn layer in a common FinFET usually ranges from 3% to 8% by atom percent, and the strained GeSn layer with a Sn content of 8% is stable at a temperature below 450° C., the heating temperature and the annealing temperature should not exceed 450° C.

Since the strained GeSn has a higher hole mobility than Ge, the strained GeSn has a good potential application in P-type FET devices. According to a theoretic research, a strained $Ge_{1-x}Sn_x$ (x>0.11) alloy will be a direct bandgap semiconductor with a good opto-electrical property. Furthermore, the GeSn alloy is compatible with a conventional silicon CMOS (complementary metal oxide semiconductor) process. Therefore, the method for forming the FinFET according to embodiments of the present disclosure is compatible with the conventional CMOS process, and the FinFET fabricated by this method has a better electrical performance.

A specific embodiment will be illustrated below for a better understanding of the present disclosure.

Firstly, a Si substrate is provided and rinsed sequentially by acetone, absolute ethyl alcohol, deionized water and hydrofluoric acid.

Secondly, a fin structure is formed on the Si substrate by a selective epitaxial growth. Specifically, a silicon nitride mask is deposited on the Si substrate, and an opening is formed in the mask by photolithography and etching, and the fin structure with the material Ge is formed in the opening by the selective epitaxial growth. A thickness of the fin structure may be controlled to be larger than that of the mask.

Thirdly, plasmas containing an element Sn are implanted into the fin structure by a plasma immersion ion implantation. An implanting voltage is 10-25 KeV, and an implanting dose is about $5 \times 10^{16}/cm^2$. During the implanting, the Si substrate is heated at a temperature ranging from 100° C. to 200° C. After the implanting is completed, a strained GeSn layer with a thickness of 15-30 nm is formed on a surface of the fin structure. The Sn content of the strained GeSn layer is about 8%. The GeSn layer may be annealed at a temperature ranging from 200° C. to 300° C. after the implanting so as to further improve the GeSn layer.

Fourthly, a gate dielectric material $HfO_2$ and a gate metal material TaN/TiAl/TiN are deposited on the GeSn layer sequentially, and a patterned gate stack $HfO_2$/TaN/TiAl/TiN is formed on the GeSn layer and is oriented transversely to the fin structure by photolithography and etching.

Fifthly, a side wall is formed on both sides of the gate stack.

Finally, a heavily doped source and a heavily doped drain are formed in the fin structure and on both sides of the gate stack respectively by ion implanting.

In this way, a FinFET device with a GeSn channel, a GeSn source and a GeSn drain is obtained.

Figure 5:
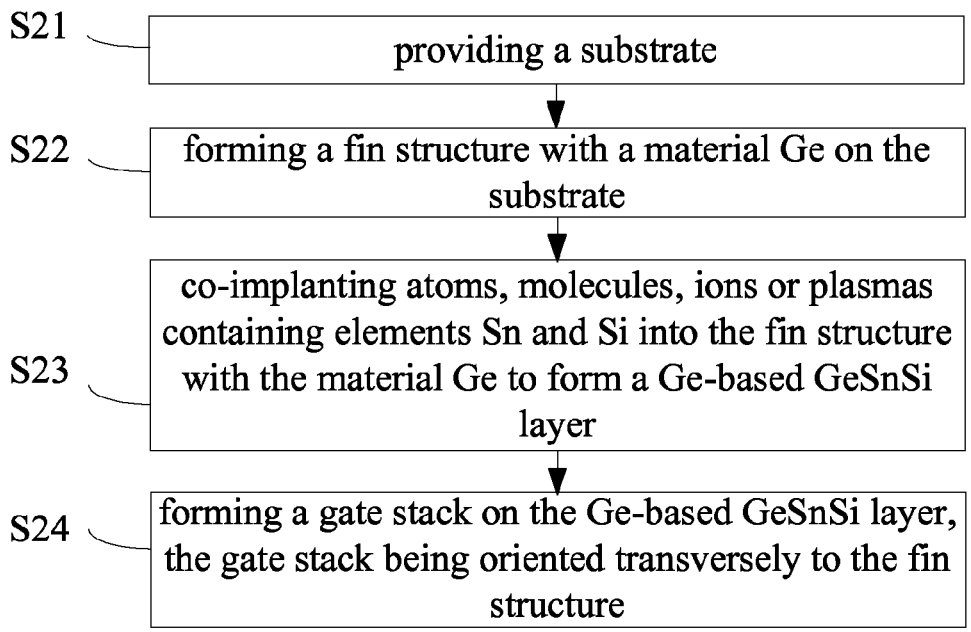
FIG. 5 is a flow chart of a method for forming a FinFET with a GeSnSi channel according to a second embodiment of the present disclosure.

FIG. 5 is a flow chart of a method for forming a FinFET with a GeSnSi channel according to a second embodiment of the present disclosure. As shown in FIG. 5, the method may comprise following steps.

At step S21, a substrate 00 is provided. Specifically, the substrate 00 may be a semiconductor substrate, including, but not limited to, a Si (silicon) substrate, a Ge (germanium) substrate, a Si-on-insulator substrate, a Ge-on-insulator substrate, and a Si substrate with a Ge surface.

At step S22, a fin structure 10 with a material Ge is formed on the substrate 00, as shown in FIGS. 2a and 2b. Specifically, the fin structure 10 with the material Ge is formed on a specific region of the substrate 00 where a source, a drain and a channel are preset.

In an exemplary example, the fin structure 10 with the material Ge may be formed by a selective epitaxial growth. In this case, since the material Ge of the fin structure 10 is not an inherent material of the substrate 00 but is epitaxially grown on the substrate 00 later, the substrate 00 may be selected from a broad range of substrates, such as a Si substrate, a Ge substrate, a Si-on-insulator substrate, a Ge-on-insulator substrate, a Si substrate with the Ge surface, a GeSi-on-insulator substrate, a Si substrate with a GeSi surface, and a Ge substrate with a GeSi surface. In some embodiments, the substrate 00 may be one of a Si substrate, a Si-on-insulator substrate, a Ge-on-insulator substrate, and a Si substrate with a Ge surface.

In another exemplary example, the fin structure 10 with the material Ge may be formed by a photolithography and etching. In this case, since the material Ge of the fin structure 10 is the inherent material of the substrate 00, the substrate 00 may be selected from a relatively narrow range of substrates, such as a Ge substrate, a Ge-on-insulator substrate, or a Si substrate with a Ge surface, that is, the substrate 00 should at least have a Ge surface.

At step S23, atoms, molecules, ions or plasmas containing elements Sn and Si are co-implanted into the fin structure 10 with the material Ge to form a GeSnSi layer.

In one embodiment, a surface of the fin structure 10 may be implanted to form the GeSnSi layer. In another embodiment, the whole fin structure 10 may be implanted to form the GeSnSi layer.

In an exemplary example, the implantation may be implemented by an ion implantation, that is, an ion beam (including ions or plasmas) with certain energy and containing the elements Sn and Si is injected into the fin structure 10 with the material Ge, such that a part of the fin structure 10 or the whole fin structure 10 is converted into a GeSnSi alloy (i.e., the GeSnSi layer). An implanting depth depends on the energy of the ion beam, that is, the higher the energy of the ion beam is, the larger the implanting depth is, and thus the thicker the GeSnSi layer is. In one embodiment, a thickness of the GeSnSi layer may range from 0.5 nm to 100 nm. During the implanting, a varying voltage may be used to vary the energy of the ion beam, such that the elements Sn and Si may be distributed uniformly within a certain range. Specifically, the ion implantation may comprise a plasma source ion implantation and a plasma immersion ion implantation, i.e., a plasma-based ion implantation (PBII). For the PBII, the fin structure 10 with the material Ge is immersed in the plasmas containing the elements Sn and Si, positive plasmas containing the elements Sn and Si are accelerated by an electric field, injected to the surface of the fin structure 10 and finally implanted into the fin structure 10. It is easy to achieve a high implanting dose by the PBII, for example, a Sn content of the GeSnSi layer may range from 1% to 20%. In this way, a production efficiency is improved and the cost is lowered. Since the PBII is less affected by a morphology of a substrate surface, it is particularly preferred for nonplanar structures (such as the fin structure) to ensure a uniform implantation, such that a uniform GeSnSi film may be formed in the whole channel region, thus greatly improving the electrical performance of the channel.

In another exemplary example, the implantation may be implemented by a magnetron sputtering. During the magnetron sputtering, Ar ions are accelerated by an electric field to reach a Si—Sn (i.e., a mixture of Si and Sn) target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the fin structure 10 with the material Ge at a higher speed. A portion of the sputtered particles may be implanted into the fin structure 10 to form the metastable GeSnSi alloy. Alternatively, during the magnetron sputtering, a negative bias voltage (for example, ranging from −40 to −120V) is applied to the substrate 00, which may provide the portion of the sputtered particles with higher energy so as to implant these sputtered particles into a larger depth (such as a few nanometers) of the fin structure 10. It should be noted that, because a great number of particles are sputtered, a Si—Sn (i.e., a mixture of Si and Sn) coating film may be further formed on the GeSnSi layer. Therefore, the method further comprises removing the Si—Sn coating film, for example, by means of a rinse solution with a high selective etching ratio between GeSnSi and Si—Sn. Such a rinse solution comprises: diluted hydrochloric acid, diluted sulphuric acid and diluted nitric acid. After rinsing, the thickness of the GeSnSi layer may range from 0.5 nm to 20 nm, preferably, from 0.5 nm to 10 nm.

In one example, an ion beam sputtering is also used to implant Sn atoms and Si atoms into the fin structure 10. By adjusting the energy of the ion beam, most sputtered particles contain only a single Sn atom and Sn atoms are not liable to aggregation, thus improving the quality and the thermal stability of the GeSnSi layer.

At step S24, a gate stack 30 is formed on the GeSnSi layer and is oriented transversely to the fin structure 10, as shown in FIG. 3. Specifically, the gate stack 30 comprises a gate dielectric layer 30a and a gate metal 30b.

In one embodiment, the method further comprises forming a side wall on both sides of the gate stack 30. The side wall may reduce a leakage current of a device.

In one embodiment, the method further comprises forming a source and a drain in the fin structure and on both sides of the gate stack 30 respectively. A material of the source and the drain may be GeSnSi or Ge. If the material of the source and the drain is GeSnSi, the whole fin structure 10 with the material Ge is implanted to form the GeSnSi layer 20, as shown in FIG. 4a. In this case, the GeSnSi layer 20 functions as the source, the drain and the channel. If the material of the source and the drain is Ge, only a central region (i.e., a channel region) of the fin structure 10 with the material Ge is implanted to form the GeSnSi layer 20, as shown in FIG. 4b, while a remaining region (i.e., preset for a source region and a drain region) of the fin structure 10 is covered by photoresist. In this case, the GeSnSi layer 20 functions only as the channel. It should be noted that, the source and the drain may be formed either after or before forming the gate stack. That is, for a gate-first process, firstly the gate stack is formed and then the source and the drain are formed; for a gate-last process, firstly a dummy gate is formed on the GeSnSi layer 20, then the source and the drain are formed on both sides of the dummy gate respectively, and finally the dummy gate is removed and the gate stack is formed at a place where the dummy gate is originally formed.

With the method for forming the FinFET, the GeSnSi channel with a better crystalline quality is obtained, such that the electrical performance of the FinFET is significantly improved. In addition, the method is simple to implement and low in cost.

In this embodiment, the substrate 00 may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., less than 100° C.), such that the quality of the GeSnSi layer may be poor and GeSnSi in the GeSnSi layer is liable to form an amorphous state. Sn atoms in the GeSnSi layer may be seriously diffused at an over high heating temperature (e.g., higher than 600° C.), such that Sn atoms may be segregated from the GeSnSi layer since an equilibrium solid solubility of Sn in Ge is very low.

In this embodiment, the GeSnSi layer may be annealed after the implanting so as to further improve the GeSnSi layer. An annealing temperature may range from 100° C. to 600° C., preferably from 150° C. to 450° C. The lattice damage resulting from the implantation may not be repaired at an over low annealing temperature (e.g., less than 100° C.), such that the quality of the GeSnSi layer may be poor. Sn atoms in the GeSnSi layer may be seriously diffused at an over high annealing temperature (e.g., higher than 600° C.), such that the Sn atoms may be segregated from the GeSnSi layer since the equilibrium solid solubility of Sn in Ge is very low.

In this embodiment, the GeSnSi layer is strained. A thickness of the strained GeSnSi layer may range from 0.5 nm to 100 nm, preferably from 5 nm to 60 nm. In this embodiment, a Sn content of the strained GeSnSi layer is less than 20% by atom percent. It should be noted that, the higher the Sn content of the fully strained GeSnSi layer is, the larger the strain degree of the fully strained GeSnSi layer is, and correspondingly the thickness of the strained GeSnSi layer should be less than its critical thickness to keep it fully strained, that is, the higher the Sn content of the strained GeSnSi layer is, the smaller the critical thickness of the strained GeSnSi layer is. For example, when the Si content of the strained GeSnSi layer is 20% and the Sn content of the strained GeSnSi layer is 15%, the strain degree of the fully strained GeSnSi layer is about 1.5%, and the critical thickness of the strained GeSnSi layer is about 30 nm, that is, a thickness of the channel of the FinFET should be equal to or less than 30 nm. Also for example, when the Si content of the strained GeSnSi layer is 20% and the Sn content of the strained GeSnSi layer is 10%, the strain degree thereof is about 0.8%, and the critical thickness thereof may be over 100 nm, that is, the thickness of the channel of the FinFET may be 100 nm while the GeSnSi layer remains fully strained.

It should be noted that, when the GeSnSi layer is strained, the heating temperature and the annealing temperature need to match with material properties of the strained GeSnSi layer. For example, because the Sn content of the strained GeSnSi layer in a common FinFET usually ranges from 10% to 15% by atom percent, by adding the element Si, the strained GeSnSi layer with a Sn content of 10%-15% is basically stable at a temperature below 450° C., the heating temperature and the annealing temperature should not exceed 450° C.

Since the strained GeSnSi has a higher hole mobility than Ge, the strained GeSnSi has a good potential application in P-type FET devices. Furthermore, the GeSnSi alloy is compatible with a conventional silicon CMOS process. Therefore, the method for forming the FinFET according to embodiments of the present disclosure is compatible with the conventional CMOS process, and the FinFET fabricated by this method has a better electrical performance.

A specific embodiment will be illustrated below for a better understanding of the present disclosure.

Firstly, a Si substrate is provided and rinsed sequentially by acetone, absolute ethyl alcohol, deionized water and hydrofluoric acid.

Secondly, a fin structure is formed on the Si substrate by a selective epitaxial growth. Specifically, a silicon nitride mask is deposited on the Si substrate, and an opening is formed in the mask by photolithography and etching, and the fin structure with the material Ge is formed in the opening by the selective epitaxial growth. A thickness of the fin structure may be controlled to be larger than that of the mask.

Thirdly, plasmas containing elements Sn and Si are implanted into the fin structure by a plasma immersion ion implantation. An implanting voltage is 10-25 KeV, an implanting dose of Si is about $1 \times 10^{17}/cm^2$, and an implanting dose of Sn is about $8 \times 10^{16}/cm^2$. During the implanting, the Si substrate is heated at a temperature ranging from 100° C. to 200° C. After the implanting is completed, a strained GeSnSi layer with a thickness of 15-30 nm is formed on a surface of the fin structure. The Sn content of the strained GeSnSi layer is about 15%. The GeSnSi layer may be annealed at a temperature ranging from 200° C. to 300° C. after the implanting so as to further improve the GeSnSi layer.

Fourthly, a gate dielectric material $HfO_2$ and a gate metal material TaN/TiAl/TiN are deposited on the Si substrate sequentially, and a patterned gate stack $HfO_2$/TaN/TiAl/TiN is formed on the GeSnSi layer and is oriented transversely to the fin structure by photolithography and etching.

Fifthly, a side wall is formed on both sides of the gate stack.

Finally, a heavily doped source and a heavily doped drain are formed in the fin structure and on both sides of the gate stack respectively by ion implanting.

In this way, a FinFET device with a GeSnSi channel, a GeSnSi source and a GeSnSi drain is obtained.

Figure 6:
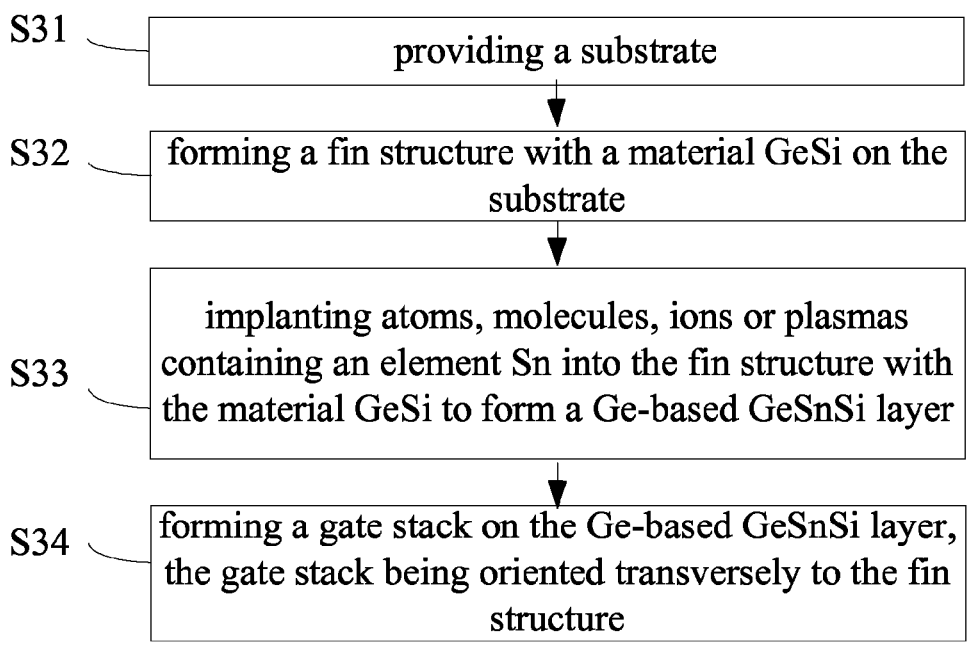
FIG. 6 is a flow chart of a method for forming a FinFET with a GeSnSi channel according to a third embodiment of the present disclosure.

FIG. 6 is a flow chart of a method for forming a FinFET with a GeSnSi channel according to a third embodiment of the present disclosure. As shown in FIG. 6, the method may comprise following steps.

At step S31, a substrate 00 is provided. Specifically, the substrate 00 may be a semiconductor substrate, including, but not limited to, a Si (silicon) substrate, a Ge (germanium) substrate, a Si-on-insulator substrate, a Ge-on-insulator substrate, a GeSi-on-insulator substrate, and a Si or Ge substrate with a GeSi surface.

At step S32, a fin structure 10 with a material GeSi is formed on the substrate 00, as shown in FIGS. 2a and 2b. Specifically, the fin structure 10 with the material GeSi is formed on a specific region of the substrate 00 where a source, a drain and a channel are preset.

In an exemplary example, the fin structure 10 with the material GeSi may be formed by a selective epitaxial growth. In this case, since the material GeSi of the fin structure 10 is not an inherent material of the substrate 00 but is epitaxially grown on the substrate 00 later, the substrate 00 may be selected from a broad range of substrates, such as a Si substrate, a Ge substrate, a Si-on-insulator substrate, a Ge-on-insulator substrate, a Si substrate with a Ge surface, a GeSi-on-insulator substrate, a Si substrate with a GeSi surface, and a Ge substrate with a GeSi surface. In some embodiments, the substrate 00 may be one of a Si substrate, a Si-on-insulator substrate, a Ge-on-insulator substrate, a GeSi-on-insulator substrate, and a Si substrate with a GeSi surface.

In another exemplary example, the fin structure 10 with the material GeSi may be formed by a photolithography and etching. In this case, since the material GeSi of the fin structure 10 is the inherent material of the substrate 00, the substrate 00 may be selected from a relatively narrow range of substrates, such as a GeSi-on-insulator substrate, a Si substrate with a GeSi surface, or a Ge substrate with a GeSi surface, that is, the substrate 00 should at least have a GeSi surface.

At step S33, atoms, molecules, ions or plasmas containing an element Sn are implanted into the fin structure 10 with the material GeSi to form a GeSnSi layer.

In one embodiment, a surface of the fin structure 10 may be implanted to form the GeSnSi layer. In another embodiment, the whole fin structure 10 may be implanted to form the GeSnSi layer.

In an exemplary example, the implantation may be implemented by an ion implantation, that is, an ion beam (including ions or plasmas) with certain energy and containing the element Sn is injected into the fin structure 10 with the material GeSi, such that a part of the fin structure 10 or the whole fin structure 10 is converted into a GeSnSi alloy (i.e., the GeSnSi layer). An implanting depth depends on the energy of the ion beam, that is, the higher the energy of the ion beam is, the larger the implanting depth is, and thus the thicker the GeSnSi layer is. In one embodiment, a thickness of the GeSnSi layer may range from 0.5 nm to 100 nm. During the implanting, a varying voltage may be used to vary the energy of the ion beam, such that the element Sn may be distributed uniformly within a certain range. Specifically, the ion implantation may comprise a plasma source ion implantation and a plasma immersion ion implantation, i.e., a plasma-based ion implantation (PBII). For the PBII, the fin structure 10 with the material GeSi is immersed in the plasmas containing the element Sn, positive plasmas containing the element Sn are accelerated by an electric field, injected to the surface of the fin structure 10 and finally implanted into the fin structure 10. It is easy to achieve a high implanting dose by the PBII, for example, a Sn content of the GeSnSi layer may range from 1% to 20%. In this way, a production efficiency is improved and the cost is lowered. Since the PBII is less affected by a morphology of a substrate surface, it is particularly preferred for nonplanar structures (such as the fin structure) to ensure a uniform implantation, such that a uniform GeSnSi film may be formed in the whole channel region, thus greatly improving the electrical performance of the channel.

In another exemplary example, the implantation may be implemented by a magnetron sputtering. During the magnetron sputtering, Ar ions are accelerated by an electric field to reach a Sn or Sn-contained target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the fin structure 10 with the material GeSi at a higher speed. A portion of the sputtered particles may be implanted into the fin structure 10 to form the metastable GeSnSi alloy. Alternatively, during the magnetron sputtering, a negative bias voltage (for example, ranging from −40 to −120V) is applied to the substrate 00, which may provide the portion of the sputtered particles with higher energy so as to implant these sputtered particles into a larger depth (such as a few nanometers) of the fin structure 10. It should be noted that, because a great number of particles are sputtered, a Sn coating film may be further formed on the GeSnSi layer. Therefore, the method further comprises removing the Sn coating film, for example, by means of a rinse solution with a high selective etching ratio between GeSnSi and Sn. Such a rinse solution comprises: diluted hydrochloric acid, diluted sulphuric acid and diluted nitric acid. After rinsing, the thickness of the GeSnSi layer may range from 0.5 nm to 20 nm, preferably, from 0.5 nm to 10 nm.

In one example, an ion beam sputtering is also used to implant Sn atoms into the fin structure 10. By adjusting the energy of the ion beam, most sputtered particles contain only a single Sn atom and Sn atoms are not liable to aggregation, thus improving the quality and the stability of the GeSnSi layer.

At step S34, a gate stack 30 is formed on the GeSnSi layer and is oriented transversely to the fin structure 10, as shown in FIG. 3. Specifically, the gate stack 30 comprises a gate dielectric layer 30a and a gate metal 30b.

In one embodiment, the method further comprises forming a side wall on both sides of the gate stack 30. The side wall may reduce a leakage current of a device.

In one embodiment, the method further comprises forming a source and a drain in the fin structure and on both sides of the gate stack respectively. A material of the source and the drain may be GeSnSi or GeSi. If the material of the source and the drain is GeSnSi, the whole fin structure 10 with the material GeSi is implanted to form the GeSnSi layer 20, as shown in FIG. 4a. In this case, the GeSnSi layer 20 functions as the source, the drain and the channel. If the material of the source and the drain is GeSi, only a central region (i.e., a channel region) of the fin structure 10 with the material GeSi is implanted to form the GeSnSi layer 20, as shown in FIG. 4b, while a remaining region (i.e., preset for a source region and a drain region) of the fin structure 10 is covered by photoresist. In this case, the GeSnSi layer 20 functions only as the channel. It should be noted that, the source and the drain may be formed either after or before forming the gate stack. That is, for a gate-first process, firstly the gate stack is formed and then the source and the drain are formed; for a gate-last process, firstly a dummy gate is formed on the GeSnSi layer 20, then the source and the drain are formed on both sides of the dummy gate respectively, and finally the dummy gate is removed and the gate stack is formed at a place where the dummy gate is originally formed.

With the method for forming the FinFET, the GeSnSi channel with a better crystalline quality is obtained, such that the electrical performance of the FinFET is significantly improved. In addition, the method is simple to implement and low in cost.

In this embodiment, the substrate 00 may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., less than 100° C.), such that the quality of the GeSnSi layer may be poor and GeSnSi in the GeSnSi layer is liable to form an amorphous state. Sn atoms in the GeSnSi layer may be seriously diffused at an over high heating temperature (e.g., higher than 600° C.), such that Sn atoms may be segregated from the GeSnSi layer since an equilibrium solid solubility of Sn in Ge is very low.

In this embodiment, the GeSnSi layer may be annealed after the implanting so as to further improve the GeSnSi layer. An annealing temperature may range from 100° C. to 600° C., preferably from 150° C. to 450° C. The lattice damage resulting from the implantation may not be repaired at an over low annealing temperature (e.g., less than 100° C.), such that the quality of the GeSnSi layer may be poor. Sn atoms in the GeSnSi layer may be seriously diffused at an over high annealing temperature (e.g., higher than 600° C.), such that the Sn atoms may be segregated from the GeSnSi layer since the equilibrium solid solubility of Sn in Ge is very low.

In this embodiment, the GeSnSi layer is strained. A thickness of the strained GeSnSi layer may range from 0.5 nm to 100 nm, preferably from 5 nm to 60 nm. In this embodiment, a Sn content of the strained GeSnSi layer is less than 20% by atom percent. It should be noted that, the higher the Sn content of the fully strained GeSnSi layer is, the larger the strain degree of the fully strained GeSnSi layer is, and correspondingly the thickness of the strained GeSnSi layer should be less than a critical thickness to keep it fully strained, that is, the higher the Sn content of the strained GeSnSi layer is, the smaller the critical thickness of the strained GeSnSi layer is. For example, the strain degree of the GeSnSi layer on the GeSi layer is related to the Ge content and the strain degree of the GeSi layer. When the Sn content of the strained GeSnSi layer is less than 20%, the strain degree of the fully strained GeSnSi layer ranges from 0 to 4%. When the strain degree of the strained GeSnSi layer is 1.5%, the critical thickness of the strained GeSnSi layer is about 30 nm, that is, a thickness of the channel of the FinFET should be equal to or less than 30 nm. When the strain degree of the strained GeSnSi layer is 0.8%, the critical thickness of the strained GeSnSi layer may be over 100 nm, that is, the thickness of the channel of the FinFET may be 100 nm while the GeSnSi layer remains fully strained.

It should be noted that, when the GeSnSi layer is strained, the heating temperature and the annealing temperature need to match with material properties of the strained GeSnSi layer. For example, because the Sn content of the strained GeSnSi layer in a common FinFET usually ranges from 10% to 15% by atom percent, by adding the element Si, the strained GeSnSi layer with a Sn content of 10%-15% is basically stable at a temperature below 450° C., the heating temperature and the annealing temperature should not exceed 450° C.

Since the strained GeSnSi has a higher hole mobility than Ge, the strained GeSnSi has a good potential application in P-type FET devices. Furthermore, the GeSnSi alloy is compatible with a conventional silicon CMOS process. Therefore, the method for forming the FinFET according to embodiments of the present disclosure is compatible with the conventional CMOS process, and the FinFET fabricated by this method has a better electrical performance.

A specific embodiment will be illustrated below for a better understanding of the present disclosure.

Firstly, a Si substrate is provided and rinsed sequentially by acetone, absolute ethyl alcohol, deionized water and hydrofluoric acid.

Secondly, a fin structure is formed on the Si substrate by a selective epitaxial growth. Specifically, a silicon nitride mask is deposited on the Si substrate, and an opening is formed in the mask by photolithography and etching, and the fin structure with the material GeSi is formed in the opening by the selective epitaxial growth. A thickness of the fin structure may be controlled to be larger than that of the mask.

Thirdly, plasmas containing an element Sn are implanted into the fin structure by a plasma immersion ion implantation. An implanting voltage is 10-25 KeV, and an implanting dose is about $5 \times 10^{16}/cm^2$. During the implanting, the Si substrate is heated at a temperature ranging from 100° C. to 200° C. After the implanting is completed, a strained GeSnSi layer with a thickness of 15-30 nm is formed on a surface of the fin structure. The Sn content of the strained GeSnSi layer is about 8%. The GeSnSi layer may be annealed at a temperature ranging from 200° C. to 300° C. after the implanting so as to further improve the GeSnSi layer.

Fourthly, a gate dielectric material $HfO_2$ and a gate metal material TaN/TiAl/TiN are deposited on the Si substrate sequentially, and a patterned gate stack $HfO_2$/TaN/TiAl/TiN is formed on the GeSnSi layer and is oriented transversely to the fin structure by photolithography and etching.

Fifthly, a side wall is formed on both sides of the gate stack.

Finally, a heavily doped source and a heavily doped drain are formed in the fin structure and on both sides of the gate stack respectively by ion implanting.

In this way, a FinFET device with a GeSnSi channel, a GeSnSi source and a GeSnSi drain is obtained.

A FinFET is further provided according to embodiments of the present disclosure. The FinFET comprises: a substrate; a fin structure with a Ge-based GeSn layer or a Ge-based GeSnSi layer on the substrate; a gate stack on the substrate, the gate stack being oriented transversely to the fin structure; and a source and a drain in the fin structure and on both sides of the gate stack respectively. It should be noted that the FinFET with a GeSn or GeSnSi channel may be formed by a method, including, but not limited to, any of the methods described above. With the FinFET according to embodiments of the present disclosure, the GeSn or GeSnSi channel has advantages of high mobility and better crystalline quality. The FinFET device has advantages of improved electrical performance and low cost.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for forming a fin field effect transistor, comprising:
   providing a substrate;
   forming a fin structure with a material Ge or GeSi on the substrate;
   implanting atoms, molecules, ions or plasmas containing an element Sn into the fin structure with the material Ge or GeSi to form a Ge-based GeSn layer or a Ge-based GeSnSi layer; and
   forming a gate stack on the Ge-based GeSn layer or the Ge-based GeSnSi layer, the gate stack being oriented transversely to the fin structure.

2. The method according to claim 1, further comprising:
   co-implanting atoms, molecules, ions or plasmas containing the element Sn and an element Si into the fin structure with the material Ge to form the Ge-based GeSnSi layer.

3. The method according to claim 2, wherein the atoms, molecules, ions or plasmas containing the element Sn are implanted into the fin structure with the material Ge or GeSi by a magnetron sputtering.

4. The method according to claim 3, wherein during the magnetron sputtering, a negative bias voltage is applied to the substrate.

5. The method according to claim 4, wherein
   a Sn coating film is formed on the Ge-based GeSn layer or the Ge-based GeSnSi layer during the magnetron sputtering, if the atoms, molecules, ions or plasmas containing only the element Sn are implanted; or a Si—Sn coating film is formed on the Ge-based GeSn layer or the Ge-based GeSnSi layer during the magnetron sputtering, if the atoms, molecules, ions or plasmas containing the element Sn and the element Si are co-implanted.

6. The method according to claim 5, further comprising removing the Sn coating film or the Si—Sn coating film.

7. The method according to claim 1, wherein the fin structure with the material Ge or GeSi is formed by a selective epitaxial growth.

8. The method according to claim 1, wherein the fin structure with the material Ge is formed by a photolithography and etching, and the substrate has a surface with a material Ge.

9. The method according to claim 1, wherein the fin structure with the material GeSi is formed by a photolithography and etching, and the substrate has a surface with the material GeSi.

10. The method according to claim 1, wherein the atoms, molecules, ions or plasmas containing the element Sn are implanted into the fin structure with the material Ge or GeSi by an ion implantation.

11. The method according to claim 10, wherein the ion implantation comprises a plasma source ion implantation and a plasma immersion ion implantation.

12. The method according to claim 1, further comprising heating the substrate at a heating temperature ranging from 100° C. to 600° C. during the implanting.

13. The method according to claim 12, wherein the heating temperature ranges from 150° C. to 450° C.

14. The method according to claim 1, further comprising annealing the Ge-based GeSn layer or the Ge-based GeSnSi layer at an annealing temperature ranging from 100° C. to 600° C. after the implanting.

15. The method according to claim 14, wherein the annealing temperature ranges from 150° C. to 450° C.

16. The method according to claim 1, wherein the Ge-based GeSn layer or the Ge-based GeSnSi layer is strained.

17. The method according to claim 16, wherein a thickness of the Ge-based GeSn layer or the Ge-based GeSnSi layer ranges from 0.5 nm to 100 nm.

18. The method according to claim 17, wherein the thickness of the Ge-based GeSn layer or the Ge-based GeSnSi layer ranges from 5 nm to 60 nm.

19. The method according to claim 16, wherein a Sn content of the Ge-based GeSn layer or the Ge-based GeSnSi layer is less than 20% by atom percent.

20. The method according to claim 1, further comprising forming a source and a drain in the fin structure and on both sides of the gate stack respectively.

* * * * *